(12) United States Patent
Itai

(10) Patent No.: US 7,968,904 B2
(45) Date of Patent: Jun. 28, 2011

(54) ORGANIC ELECTROLUMINESCENCE DEVICE

(75) Inventor: Yuichiro Itai, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1062 days.

(21) Appl. No.: 11/702,173

(22) Filed: Feb. 5, 2007

(65) Prior Publication Data

US 2007/0181876 A1   Aug. 9, 2007

(30) Foreign Application Priority Data

Feb. 6, 2006   (JP) ................................. 2006-028994
Feb. 6, 2006   (JP) ................................. 2006-028995

(51) Int. Cl.
H01L 33/00   (2010.01)
(52) U.S. Cl. .................. 257/101; 257/40; 257/E51.048; 313/504; 313/506
(58) Field of Classification Search .............. 257/40, 257/101, E51.048; 438/99; 428/917; 313/504, 313/506
See application file for complete search history.

(56) References Cited

U.S. PATENT DOCUMENTS

| 2005/0221121 | A1* | 10/2005 | Ishihara et al. | 428/690 |
| 2006/0261333 | A1* | 11/2006 | Murakami et al. | 257/40 |
| 2006/0263917 | A1* | 11/2006 | Burroughes et al. | 438/22 |
| 2008/0003455 | A1* | 1/2008 | Li et al. | 428/690 |
| 2010/0051930 | A1* | 3/2010 | Kido et al. | 257/40 |

FOREIGN PATENT DOCUMENTS

| JP | 4-297076 A | 10/1992 |
| JP | 2000-196140 A | 7/2000 |
| JP | 2005-32618 A | 2/2005 |
| JP | 2005-251639 A | 9/2005 |
| JP | 2006-324537 A | 11/2006 |
| JP | 2007-5784 A | 1/2007 |
| WO | WO 2004/064453 A1 | 7/2004 |
| WO | WO 2005/064994 A1 | 7/2005 |

OTHER PUBLICATIONS

Japanese Notice of Reasons for Rejection dated Sep. 14, 2010 for Japanese Application No. 2006-028994.
Japanese Notice of Reasons for Rejection dated Sep. 14, 2010 for Japanese Application No. 2006-028995.

* cited by examiner

*Primary Examiner* — Matthew C Landau
*Assistant Examiner* — Colleen E Snow
(74) *Attorney, Agent, or Firm* — Birch, Stewart, Kolasch & Birch, LLP

(57) ABSTRACT

There is provided an organic electroluminescence device that is high in light emitting efficiency and excellent in driving durability, which contains at least a light emitting layer between an anode and a cathode opposing each other, and further has either 1) an organic layer containing at least a first acceptor and a second acceptor between the light emitting layer and the anode, in which the first acceptor is a metal compound and the second acceptor is an organic compound which does not contain a metal, or 2) an organic layer containing a metal oxide as an acceptor between the light emitting layer and the anode, in which a concentration of the metal oxide in the organic layer is varied in a thickness direction and the concentration is lower in a portion near the light emitting layer than a portion near the anode.

10 Claims, No Drawings

ORGANIC ELECTROLUMINESCENCE DEVICE

CROSS-REFERENCE TO RELATED APPLICATION

This application claims priority under 35 USC 119 from Japanese Patent Application Nos. 2006-28994 and 2006-28995, the disclosures of which are incorporated by reference herein.

BACKGROUND OF THE INVENTION

1. Field of the Invention

The invention relates to an organic electroluminescent device (which is referred to hereinafter as an "organic EL device" in some cases) and, in particular, relates to an organic EL device which obtains light emission of high luminance with low driving power.

2. Description of the Related Art

Organic electroluminescent devices containing a thin film material that emits light by excitation due to application of electric current are known. The organic electroluminescent devices obtain high-brightness light emission at low voltage and therefore have broad potential applications in fields such as cellular phone displays, personal digital assistants (PDA), computer displays, car information displays, TV monitors, and general illumination, and they also have advantages of reducing the thickness, weight, size, and power consumption of the devices in the respective fields. Accordingly, such devices are greatly expected to become the leading devices in the future electronic display market. However, there are still many technical problems to overcome, such as with respect to luminescence brightness and color tone, durability under various ambient operating conditions, and mass productivity at low cost, in order for these devices to be practically used in these fields in place of conventional display devices.

Particularly, one problem is to improve luminance and driving power. First of all, it is a problem to realize high luminance in many of the above-described devices, when small thickness, light weight and small size thereof are aimed for. When the small thickness and the light weight are aimed for, it is demanded to realize compactness and light weight of not only the devices but also the driving power sources thereof. Particularly, when the power is supplied from a primary or secondary cell, power saving is a major problem, and it is strongly desired to obtain a high luminance with a low driving voltage. Conventionally, in order to obtain a high luminance, a high voltage has been required, and as a result, power is quickly consumed. Further, the high luminance and the high voltage result in deteriorating durability of the devices.

In JP-A Nos. 4-297076 and 2000-196140, attempts in which an organic compound layer which is doped with a metal compound dopant as an acceptor is arranged in a hole transport layer are disclosed. However, introduction of the acceptor in the hole transport layer has a disadvantage of deteriorating light emitting efficiency. Therefore, a measure for improving driving durability without deteriorating light emitting efficiency is demanded.

Further, in WO 2005-064994A1, it is disclosed to continuously change an acceptor concentration such that it becomes higher in a portion which is nearer to the light emitting layer. However, in this case, the effect of the acceptor is not sufficiently exerted, and sufficient improvement can not be obtained in each of light emitting efficiency and driving durability.

SUMMARY OF THE INVENTION

The present invention has been made in view of the above circumstances and provides an organic electroluminescence device comprising at least a light emitting layer between an anode and a cathode opposing each other, and further comprising an organic layer including at least a first acceptor and a second acceptor between the light emitting layer and the anode, wherein the first acceptor is a metal compound, and the second acceptor is an organic compound which does not contain metal.

A second aspect of the invention is to provide an organic electroluminescence device comprising at least a light emitting layer between an anode and a cathode opposing each other, and further comprising an organic layer having a metal oxide as an acceptor between the light emitting layer and the anode, wherein a concentration of the metal oxide in the organic layer is varied in a thickness direction thereof, and the concentration is lower in a portion near the light emitting layer than in a portion near the anode.

DETAILED DESCRIPTION OF THE INVENTION

An object of the present invention is to provide an organic EL device which, particularly, has high light emitting efficiency and also high driving durability.

Conventionally, it has been known that driving durability is improved by providing an organic layer containing an acceptor, and thereby, restraining a mobility of holes. However, in this case, there is a disadvantage in that light emitting efficiency is deteriorated, and therefore, it is difficult to realize both high light emitting efficiency and high driving durability.

The present inventors have carried out intensive studies, and as a result, there is provided, as a first aspect, an organic EL device, which has at least a light emitting layer between an anode and a cathode opposing each other, wherein high driving durability can be attained while maintaining high light emitting efficiency by including an organic layer containing a first acceptor and a second acceptor between the light emitting layer and the anode, wherein the first acceptor is a metal compound and the second acceptor is an organic compound which does not contain any metal.

As a second aspect, there is provided an organic EL device, wherein high driving durability can be attained while maintaining high light emitting efficiency by including an organic layer containing a metal oxide as an acceptor and allowing a concentration of the metal oxide to be lower in a portion of the organic layer which is nearer to the light emitting layer than in a portion which is nearer to the anode. Further preferably, the object of the present application is achieved by arranging a hole transport layer which does not substantially contain an acceptor between the hole injection layer which contains the acceptor and the light emitting layer.

According to the present invention, an organic EL device capable of obtaining light emission with high luminance at a low driving voltage is provided. Further, an organic EL device that is capable of obtaining light emission with high luminance at a low driving voltage and is excellent in driving durability is provided.

In the following, the organic electroluminescence device of the present invention will be described in detail.

(Constitution)

An organic EL device in the present invention has an organic layer comprising at least a light emitting layer between a pair of electrodes (an anode and a cathode) opposing to each other, and preferably has a hole transport layer between the anode and the light emitting layer, or an electron transport layer between the cathode and the light emitting layer.

In view of the nature of an electroluminescence device, it is preferred that at least either electrode of the pair of electrodes is transparent.

As a lamination pattern of the organic compound layers of the organic EL device in the present invention, it is preferable that one emission unit comprises layers laminated in the order of a positive hole-transport layer, a light-emitting layer, and electron-transport layer from the anode side, and multiple emission units are laminated. Moreover, a positive hole-transporting intermediate layer between the positive hole-transport layer and the light-emitting layer, and/or an electron transporting intermediate layer between the light-emitting layer and the electron-transport layer may be provided. Further, a positive hole-injection layer may be provided in between the anode and the positive hole-transport layer, and similarly an electron-injection layer may be provided in between the cathode and the electron-transport layer. Preferably, an electrically insulating charge-generating layer is provided between the emission units.

The preferred modes of the organic compound layer in the organic electroluminescence device of the present invention are as follows. (1) An embodiment having a positive hole-injection layer, a positive hole-transport layer (the positive hole-injection layer may also have the role of the positive hole-transport layer), a positive hole transporting intermediate layer, a light-emitting layer, an electron-transport layer, and an electron injection layer (the electron-transport layer may also have the role of the electron injection layer) in this order from the anode side; (2) an embodiment having a positive hole-injection layer, a positive hole-transport layer (the positive hole-injection layer may also have the role of the positive hole-transport layer), a light-emitting layer, an electron transporting immediate layer, an electron-transport layer, and an electron injection layer (the electron-transport layer may also have the role of the electron injection layer); and (3) an embodiment having a positive hole-injection layer, a positive hole-transport layer (the positive hole-injection layer may also have the role of the positive hole-transport layer), a positive hole transporting intermediate layer, a light-emitting layer, an electron transporting intermediate layer, an electron-transport layer, and an electron injection layer (the electron-transport layer may also have the role of the electron injection layer).

The above-described positive hole transporting intermediate layer preferably has at least either a function for accelerating the injection of positive holes into the light-emitting layer, or a function for blocking electrons.

Furthermore, the above-described electron transporting intermediate preferably layer has at least either a function for accelerating the injection of electrons into the light-emitting layer, or a function for blocking positive holes.

Moreover, at least either of the above-described positive hole transporting intermediate layer and the electron transporting intermediate layer preferably has a function for blocking excitons produced in the light-emitting layer.

In order to realize effectively the functions for accelerating the injection of positive hole, or the injection of electrons, and the functions for blocking positive holes, electrons, or excitons, it is preferred that the positive hole transporting intermediate layer and the electron transporting intermediate layer are adjacent to the light-emitting layer.

The respective layers mentioned above may be separated into a plurality of secondary layers.

Next, the components constituting the electroluminescence device of the present invention will be described in detail.

An organic compound layer according to the present invention will be described.

The organic electroluminescence device of the present invention has at least one organic compound layer including a light-emitting layer. Examples of the organic compound layers other than the light-emitting layer include, as mentioned above, respective layers of a positive hole-injection layer, a positive hole-transport layer, a positive hole transporting intermediate layer, a light-emitting layer, an electron transporting intermediate layer, an electron-transport layer, an electron injection layer and the like.

The respective layers constituting the organic compound layers can be suitably formed in accordance with any of a dry film-forming method such as a vapor deposition method, or a sputtering method; a transfer method; a printing method; a coating method; an ink-jet printing method; or a spray method.

(Acceptor)

The term "acceptor" as used herein means an electron acceptor and electric conductivity is exhibited by transferring an electric charge from an organic compound which constitutes a basic material to the acceptor. By such charge transfer, the acceptor and the organic compound which constitutes a basic material form a charge transfer complex.

The acceptor may or may not contain a metal.

A layer in which the acceptor is used is a hole injection layer or a hole transport layer. This is because a hole injecting material of the hole injection layer or a hole transporting material of the hole transport layer intrinsically has a property of being easily invaded with the hole, namely, the property that an electron is easily withdrawn therefrom, and thereby, the acceptor receives the thus-withdrawn electron and can constitute a charge transfer complex. When both of the hole injection layer and the hole transport layer are positioned, as is described in JP-A No. 2000-196140, it is desirable not to add the acceptor to the hole transport layer from the reason of not deteriorating light emitting efficiency.

1) First Acceptor

A first acceptor according to the present invention is selected from metal compounds. A charge is transferred from an organic compound which acts as a basic material to this metal compound, and thereby, constitutes a charge transfer complex.

As for preferable materials thereof, molybdenum oxide, vanadium oxide, rhenium oxide, NiO and $POCl_3$ (phosphorous oxychloride) are mentioned. Among these compounds, molybdenum oxide, vanadium oxide, rhenium oxide and the like which are easily vapor-deposited are particularly preferred.

A layer in which the acceptor is incorporated is a hole injection layer or a hole transport layer. This is because a hole injecting material of the hole injection layer or a hole transporting material of the hole transport layer intrinsically has a property of being easily invaded with the hole, namely, the property that an electron is easily withdrawn therefrom, and thereby, the acceptor receives the thus-withdrawn electron and can constitute a charge transfer complex. When the hole injection layer and the hole transport layer simultaneously exist, as is described in JP-A No. 2000-196140, it is desirable not to add the acceptor to the hole transport layer from the reason of not deteriorating light emitting efficiency.

An amount of the acceptor to be vapor-deposited is controlled by means of a concentration thereof against the hole injecting material or the hole transporting material which acts as a basic material. As for a specific method, the concentration thereof can be controlled by changing a temperature at which the hole injecting material or the hole transporting material is heated and a temperature at which an acceptor material is heated.

In order to increase the concentration thereof, the temperature at which the acceptor material is heated is raised, while the temperature at which the hole injecting material or the hole transporting material is heated is lowered. On the other hand, in order to decrease the concentration thereof, the temperature at which the acceptor material is heated is lowered, while the temperature at which the hole injecting material or the hole transporting material is heated is raised.

Further, as described in WO 2005-064994A1, the amount of the acceptor to be vapor-deposited can be controlled by changing each of a distance between the substrate to be deposited thereon and either the hole injecting material or the hole transporting material, or a distance between the substrate to be deposited thereon and the acceptor material. In order to increase the concentration, the distance between the substrate to be deposited thereon and either the hole injecting material or the hole transporting material is allowed to be long, while the distance between the substrate to be deposited thereon and the acceptor material is allowed to be short.

As for a pattern for changing the concentration, there is a case in which the concentration is changed stepwise or a case in which the concentration is changed continuously. In order to increase the concentration, the hole injecting material or the hole transporting material which constitutes a basic material and the acceptor material are co-deposited with a given concentration, and thereafter, the hole injecting material or the hole transporting material and the acceptor material may again be co-deposited with a different concentration. In order to change the concentration continuously, the temperature at which the hole injecting material or the hole transporting material is heated and the temperature at which the acceptor material is heated are changed continuously or each of the distance between the substrate to be deposited thereon and the hole injecting material or the hole transporting material and the distance between the substrate to be deposited thereon and the acceptor material can be changed.

2) Second Acceptor

A second acceptor according to the invention is selected from organic compounds which do not contain a metal. The organic compounds which do not contain a metal is referred hereinafter to as "an organic non-metal compound" in some cases. Such an acceptor of organic non-metallic compound can be an electron acceptor against an organic compound which constitutes a basic material and thereby, induces electric conductivity.

Preferable examples of raw materials thereof include compounds having a cyano group, such as F4-TCNQ (7,7,8,8-tetrafluorotetracyanoquinodimethane), TCNQ (tetracyanoquinodimethane), TCNE (tetracyanoethylene), HCNB (hexacyanobutadiene) and the like; 2,4,7-TNF (trinitrofluorene); and 2,7-DNF (dinitrofluorene) and the like.

In a similar manner to that in the metal compound acceptor, the second acceptor is used in the hole injection layer or the hole transport layer. When both of the hole injection layer and the hole transport layer are positioned, as described in JP-A No. 2000-196140, it is desirable not to add the acceptor to the hole transport layer from the reason of not deteriorating light emitting efficiency. The second acceptor and the first acceptor are made into a film together with an organic compound, that is, the hole injecting material which constitutes a basic material by means of ternary deposition.

3) Metal Oxide Acceptor

Hereinafter, a metal oxide acceptor to be used in a second aspect according to the invention is described.

The metal oxide acceptor is an electron acceptor and can induce electric conductivity by transferring an electric charge from an organic compound which constitutes a basic material to the acceptor. By such charge transfer, the acceptor and the organic compound which constitutes a basic material form a charge transfer complex.

Preferable examples of the metal oxide are molybdenum oxide, vanadium oxide and rhenium oxide. More preferably, the metal oxide acceptor in the present invention is molybdenum oxide or vanadium oxide.

The metal oxide acceptor in the invention is contained in an organic layer between an anode and a light emitting layer.

A layer in which the metal oxide acceptor is included preferably is a hole injection layer. This is because a hole injecting material of the hole injection layer intrinsically has a property of being easily invaded with the hole, namely, the property that an electron is easily withdrawn therefrom, and thereby, the acceptor receives the thus-withdrawn electron and can constitute a charge transfer complex. When both of the hole injection layer and the hole transport layer are positioned, as is described in JP-A No. 2000-196140, it is desirable not to add the acceptor to the hole transport layer from the reason of not deteriorating light emitting efficiency.

A concentration of the metal oxide acceptor in a layer containing the metal oxide acceptor is characterized in that it has a gradient in the layer such that it becomes lower at a side facing the anode than at a side facing the light emitting layer. Such concentration gradient may be changed either stepwise or continuously. Preferably, the concentration (Cmax) in a region having a highest concentration is in the range of from 1% by mass to 100% by mass and, more preferably, from 5% by mass to 50% by mass, while the concentration (Cmin) in a region having a lowest concentration is in the range of from 0.1% by mass to 50% by mass and, more preferably, from 1% by mass to 10% by mass. A ratio (Cmax/Cmin) of Cmax to Cmin is, preferably, 2 or more and, more preferably, 5 or more.

An amount of the acceptor to be vapor-deposited is controlled by means of a concentration thereof against the hole injecting material or the hole transporting material which constitutes a basic material. As for a specific method, the concentration thereof can be controlled by changing a temperature at which the hole injecting material or the hole transporting material is heated and a temperature at which an acceptor material is heated.

In order to increase the concentration thereof, the temperature at which the acceptor material is heated is raised, while the temperature at which the hole injecting material or the hole transporting material is heated is lowered. On the other hand, in order to decrease the concentration thereof, the temperature at which the acceptor material is heated is lowered, while the temperature at which the hole injecting material or the hole transporting material is heated is raised.

Further, as described in WO 2005-064994A1, the amount of the acceptor to be vapor-deposited can be controlled by changing each of a distance between the substrate to be deposited thereon and either the hole injecting material or the hole transporting material, or a distance between the substrate to be deposited thereon and the acceptor material. In order to increase the concentration thereof, the distance between the substrate to be deposited thereon and either the hole injecting material or the hole transporting material is allowed to be long, while the distance between the substrate to be deposited thereon and the acceptor material is allowed to be short.

As for a pattern for changing the concentration, there is a case in which the concentration is changed stepwise or a case in which the concentration is changed continuously. In order to change the concentration thereof stepwise, the hole injecting material or the hole transporting material which constitutes a basic material and the acceptor material are co-deposited with a given concentration, and thereafter, the hole injecting material or the hole transporting material and the acceptor material may again be co-deposited with a different concentration. In order to change the concentration thereof continuously, the temperature at which the hole injecting material or the hole transporting material is heated and the temperature at which the acceptor material is heated are changed continuously or each of the distance between the substrate to be deposited thereon and the hole injecting material or the hole transporting material and the distance between the substrate to be deposited thereon and the acceptor material is changed.

4) Organic Non-Metal Compound

Hereinafter, an acceptor to be selected from organic compounds which do not contain a metal (which is referred to hereinafter as an "organic non-metal compound" in some cases) to be used in a second aspect according to the invention is described.

An acceptor of the organic non-metal compound is an electron acceptor against an organic compound which constitutes a basic material and can induce electric conductivity.

Preferable examples of raw materials thereof include compounds having a cyano group, such as F4-TCNQ (7,7,8,8-tetrafluorotetracyanoquinodimethane), TCNQ (tetracyanoquinodimethane), TCNE (tetracyanoethylene), HCNB (hexacyanobutadiene) and the like; 2,4,7-TNF (trinitrofluorene); and 2,7-DNF (dinitrofluorene) and the like.

As similar to that in a metal oxide acceptor, a layer in which the organic non-metal acceptor is included preferably is a hole injection layer or a hole transport layer. When both of the hole injection layer and the hole transport layer are positioned, as is described in JP-A No. 2000-196140, it is desirable not to add the acceptor to the hole transport layer from the reason of not deteriorating light emitting efficiency. A concentration pattern of an acceptor of organic non-metal compound may basically be either uniform or variable against the concentration pattern of a metal oxide acceptor. However, as described in WO 2005-064994A1, in a case that F4-TCNQ is used as the acceptor, the concentration thereof at the side of the electrode is preferably set to be lower than those in other portions in order to prevent leakage, and furthermore, the concentration thereof at the side of interface with the hole transport layer also preferably set to be lower than those in other portions, in order to prevent deteriorating of efficiency to be caused by the fact that the electron does not contribute to the light emitting (mere escape of electron). A pattern for changing the concentration is similar to that in the metal oxide acceptor.

A concentration of the organic non-metal compound in an organic layer containing an organic non-metal compound is preferably in the range of from 0.01% by mass to 10% by mass and, more preferably, from 0.05% by mass to 1% by mass.

(Positive Hole-Injection Layer and Positive Hole-Transport Layer)

The positive hole-injection layer and positive hole-transport layer correspond to layers functioning to receive positive holes from an anode or from an anode side and to transport the positive holes to a cathode side.

As an electron-accepting dopant to be introduced into a positive hole-injection layer or a positive hole-transport layer, either of an inorganic compound or an organic compound may be used as long as the compound has electron accepting property and a function for oxidizing an organic compound. Specifically, Lewis acid compounds such as ferric chloride, aluminum chloride, gallium chloride, indium chloride, and antimony pentachloride are preferably used as the inorganic compounds.

In case of the organic compounds, compounds having substituents such as a nitro group, a halogen, a cyano group, or a trifluoromethyl group; quinone compounds, acid anhydride compounds, and fullerenes may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthoracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is particularly preferred.

These electron-accepting dopants may be used alone or in a combination of two or more of them.

Although an applied amount of these electron-accepting dopants depends on the type of material, 0.01% by mass to 50% by mass of a dopant is preferred with respect to a positive hole-transport layer material, 0.05% by mass to 20% by mass is more preferable, and 0.1% by mass to 10% by mass is particularly preferred. When the amount applied is less than 0.01% by mass with respect to the positive hole transportation material, it is not desirable because the advantageous effects of the present invention are insufficient, and when it exceeds 50% by mass, positive hole transportation ability is deteriorated, and thus, this is not preferred.

As a material for the positive hole-injection layer and the positive hole-transport layer, it is preferred to contain specifically pyrrole derivatives, carbazole derivatives, pyrazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidine compounds, porphyrin compounds, organosilane derivatives, carbon or the like.

Although a thickness of the positive hole-injection layer and the positive hole-transport layer is not particularly limited, it is preferred that the thickness is 1 nm to 5 µm, it is more preferably 5 nm to 1 µm, and 10 nm to 500 nm is particularly preferred in view of decrease in driving voltage, improvements in luminescent efficiency, and improvements in durability.

The positive hole-injection layer and the positive hole-transport layer may be composed of a monolayered structure comprising one or two or more of the above-mentioned materials, or a multilayer structure composed of plural layers of a homogeneous composition or heterogeneous compositions.

When the carrier transportation layer adjacent to the light-emitting layer is a positive hole-transport layer, it is preferred that the Ip (HTL) of the positive hole-transport layer is smaller than the Ip (D) of the dopant contained in the light-emitting layer in view of driving durability.

The Ip (HTL) in the positive hole-transport layer may be measured in accordance with the below-mentioned measuring method of Ip.

A carrier mobility in the positive hole-transport layer is usually from $10^{-7}$ cm$^2$·V$^{-1}$·s$^{-1}$ to $10^{-1}$ cm$^2$·V$^{-1}$·s$^{-1}$; and in this range, from $10^{-5}$ cm$^2$·V$^{-1}$·s$^{-1}$ to $10^{-1}$ cm$^2$·V$^{-1}$·s$^{-1}$ is preferable; from $10^{-4}$ cm$^2$·V$^{-1}$·s$^{-1}$ to $10^{-1}$ cm$^2$·V$^{-1}$·s$^{-1}$ is more preferable; and from $10^{-3}$ cm$^2$·V$^{-1}$·s$^{-1}$ to $10^{-1}$ cm$^2$·V$^{-1}$·s$^{-1}$ is particularly preferable in view of the luminescent efficiency.

For the carrier mobility, a value measured in accordance with the same method as that of the carrier mobility of the above-described light-emitting layer is adopted.

Moreover, it is preferred that the carrier mobility in the positive hole-transport layer is higher than that in the above-described light-emitting layer in view of driving durability and luminescent efficiency.

(Electron Injection Layer and Electron-Transport Layer)

The electron injection layer and the electron-transport layer are layers having any of functions for injecting electrons from the cathode, transporting electrons, and becoming a barrier to positive holes which could be injected from the anode.

As a material applied for the electron-donating dopant with respect to the electron injection layer or the electron-transport layer, any material may be used as long as it has an electron-donating property and a property for reducing an organic compound, and alkaline metals such as Li, alkaline earth metals such as Mg, and transition metals including rare-earth metals are preferably used.

Particularly, metals having a work function of 4.2 V or less are preferably applied, and specific examples thereof include Li, Na, K, Be, Mg, Ca, Sr, Ba, Y, Cs, La, Sm, Gd, and Yb.

These electron-donating dopants may be used alone or in a combination of two or more of them.

An applied amount of the electron-donating dopants differs dependent on the types of the materials, but it is preferably 0.1% by mass to 99% by mass with respect to an electron-transport layer material, more preferably 1.0% by mass to 80% by mass, and particularly preferably 2.0% by mass to 70% by mass. When the amount applied is less than 0.1% by mass, the efficiency of the present invention is insufficient so that it is not desirable, and when it exceeds 99% by mass, the electron transportation ability is deteriorated so that it is not preferred.

Specific examples of the materials applied for the electron injection layer and the electron-transport layer include pyridine, pyrimidine, triazine, imidazole, triazole, oxazole, oxadiazole, fluorenone, anthraquinodimethane, anthrone, diphenylquinone, thiopyrandioxide, carbodiimide, imide, fluorenylidenemethane, distyrylpyradine, fluorine-substituted aromatic compounds, naphthalene, heterocyclic tetracarboxylic anhydrides such as perylene, phthalocyanine, and the derivatives thereof (which may form condensed rings with the other rings); and metal complexes represented by metal complexes of 8-quinolinol derivatives, metal phthalocyanine, and metal complexes containing benzoxazole, or benzothiazole as the ligand.

Although a thickness of the electron injection layer and the electron-transport layer is not particularly limited, it is preferred that the thickness is in 1 nm to 5 µm, it is more preferably 5 nm to 1 µm, and it is particularly preferably 10 nm to 500 nm in view of decrease in driving voltage, improvements in luminescent efficiency, and improvements in durability.

The electron injection layer and the electron-transport layer may have either a monolayered structure comprising one or two or more of the above-mentioned materials, or a multilayer structure composed of plural layers of a homogeneous composition or a heterogeneous composition.

When the carrier transportation layer adjacent to the light-emitting layer is an electron-transport layer, it is preferred that the Ea (ETL) of the electron-transport layer is higher than the Ea (D) of the dopants contained in the light-emitting layer in view of driving durability.

For the Ea (ETL), a value measured in accordance with the same manner as the measuring method of Ea, which will be mentioned later, is used.

Furthermore, the carrier mobility in the electron-transport layer is usually from $10^{-7}$ cm$^2$·V$^{-1}$·s$^{-1}$ to $10^{-1}$ cm$^2$·V$^{-1}$·s$^{-1}$, and in this range, from $10^{-5}$ cm$^2$·V$^{-1}$·s$^{-1}$ to $10^{-1}$ cm$^2$·V$^{-1}$·s$^{-1}$ is preferable, from $10^{-4}$ cm$^2$·V$^{-1}$·s$^{-1}$ to $10^{-1}$ cm$^2$·V$^{-1}$·s$^{-1}$ is more preferable, and from $10^{-3}$ cm$^2$·V$^{-1}$·s$^{-1}$ to $10^{-1}$ cm$^2$·V$^{-1}$·s$^{-1}$ is particularly preferred, in view of luminescent efficiency.

Moreover, it is preferred that the carrier mobility in the electron-transport layer is higher than that of the light-emitting layer in view of driving durability. The carrier mobility is measured in accordance with the same method as that of the positive hole-transport layer.

As to the carrier mobility of the luminescent device of the present invention, it is preferred that the carrier mobility in the positive hole-transport layer, the electron-transport layer, and the light-emitting layer has the relationship of (electron-transport layer≧positive hole-transport layer)>light-emitting layer in view of driving durability.

As the host material contained in the buffer layer, the below-mentioned positive hole transporting host or electron transporting host may be preferably used.

(Light-Emitting Layer)

The light-emitting layer is a layer having a function for receiving positive holes from the anode, the positive hole-injection layer, the positive hole-transport layer or the positive hole transporting buffer layer, and receiving electrons from the cathode, the electron injection layer, the electron-transport layer, or the electron transporting buffer layer, and for providing a field for recombination of the positive holes with the electrons to emit a light.

The light-emitting layer of the present invention contains at least one type of luminescent dopant and a plurality of host compounds.

The light-emitting layer may be composed of either one layer or two or more layers wherein the respective layers may emit light of different colors from one another in the respective layers. Even if the light-emitting layers are composed of a plurality thereof, it is preferred that each of the light-emitting layers contains at least one luminescent dopant and a plurality of host compounds.

The luminescent dopant and the plural host compounds contained in the light-emitting layer of the present invention may be either a combination of a fluorescence luminescent dopant in which the luminescence (fluorescence) from a singlet exciton is obtained and the plurality of host compounds, or a combination of a phosphorescence luminescent dopant in which the luminescence (phosphorescence) from triplet exciton is obtained and the plurality of host compounds; among these, a combination of the phosphorescence luminescent dopant and the plurality of host compounds is preferable in view of luminescent efficiency.

The light-emitting layer of the present invention may contain two or more types of luminescent dopants for improving color purity and expanding the luminescent wavelength region.

<<Luminescent Dopant>>

Any of phosphorescent emission materials, fluorescent emission materials and the like may be used as the luminescent dopant in the present invention.

It is preferred that the luminescent dopant in the present invention is one satisfying a relationship between the above-described host compound and the luminescent dopant of 1.2 eV>ΔIp>0.2 eV and/or 1.2 eV>ΔEa>0.2 eV in view of driving durability.

<<Phosphorescence Luminescent Dopant>>

Examples of the above-described phosphorescence luminescent dopant generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. No. 6,303, 238B1, U.S. Pat. No. 6,097,147, WO00/57676, WO00/70655, WO01/08230, WO01/39234A2, WO01/41512A1, WO02/02714A2, WO02/15645A1, WO02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP1211257, JP-A Nos. 2002-226495, 2002-234894, 2001-247859, 2001-298470, 2002-173674, 2002-203678, 2002-203679, and 2004-357791, Japanese Patent Application Nos. 2005-75340 and 2005-75341, etc. Among these, more preferable examples of the luminescent dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred.

<<Fluorescence Luminescent Dopant>>

Examples of the above-described fluorescence luminescent dopants generally include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (anthracene, phenanthroline, pyrene, perylene, rubrene, pentacene and the like), a variety of metal complexes represented by metal complexes of 8-quinolynol, pyromethene complexes or rare-earth complexes, polymer compounds such as polythiophene, polyphenylene or polyphenylenevinylene, organic silanes, and derivatives thereof.

Among these, specific examples of the luminescent dopants include the following compounds, but it should be noted that the present invention is not limited thereto.

D-1

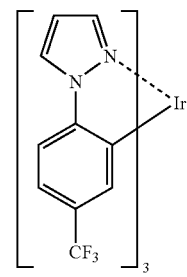

-continued
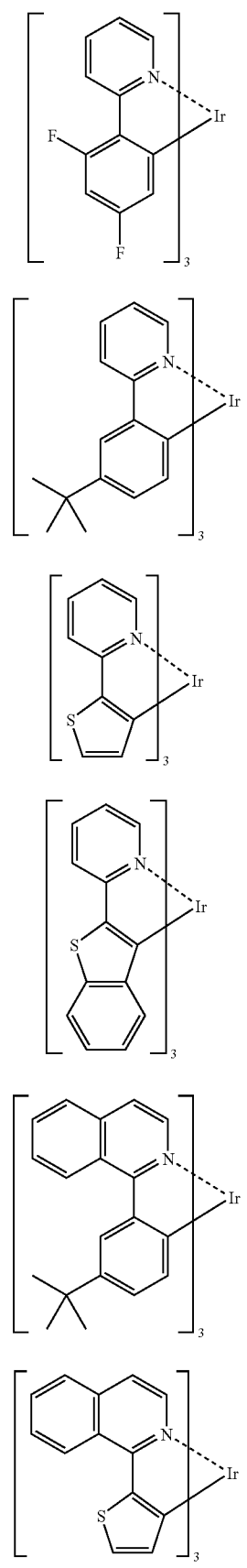
D-2
D-3
D-4
D-5
D-6
D-7
-continued
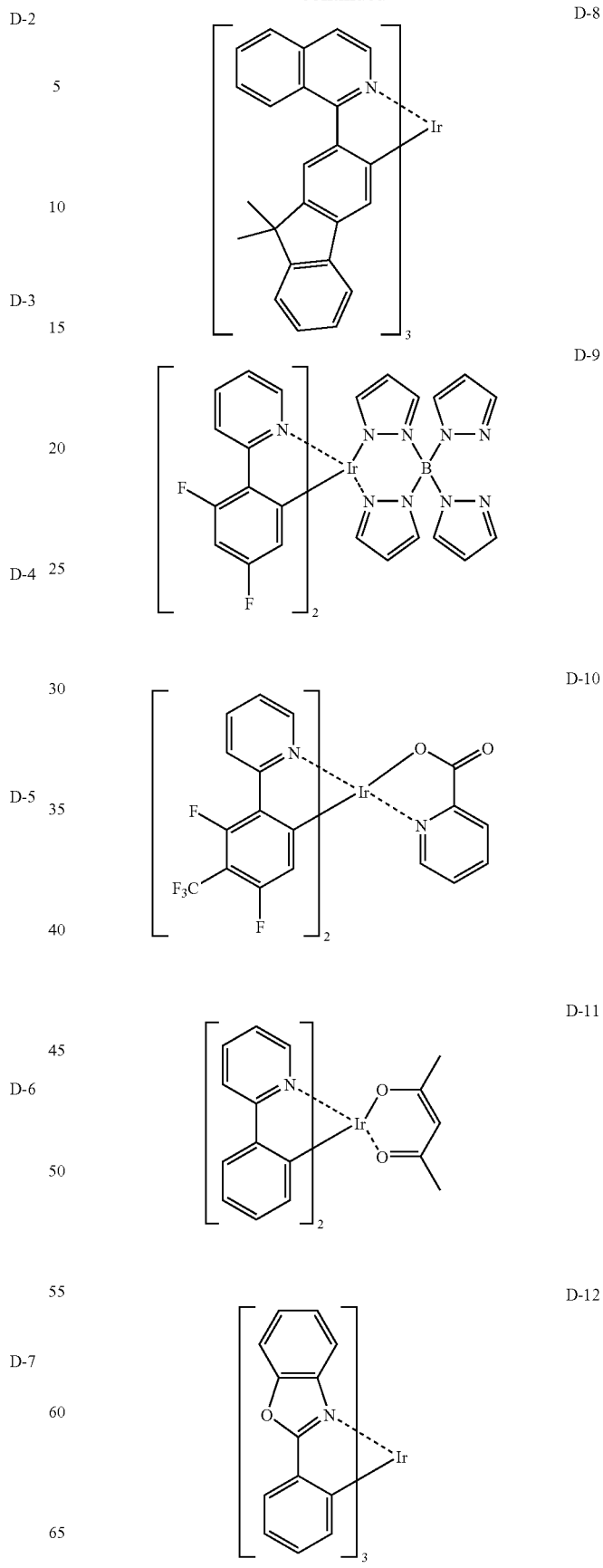
D-8
D-9
D-10
D-11
D-12

D-13
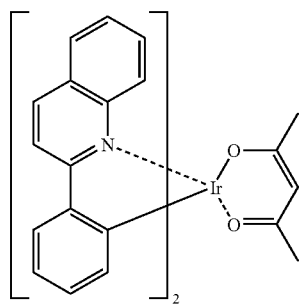
D-14
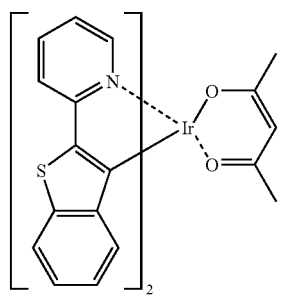
D-15
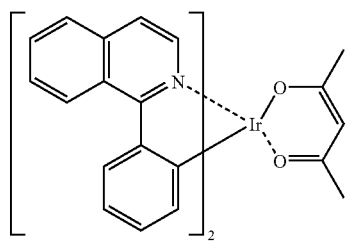
D-16
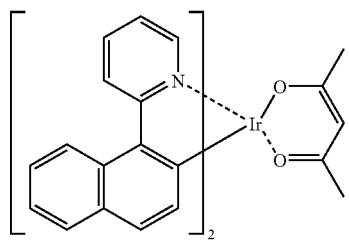
D-17
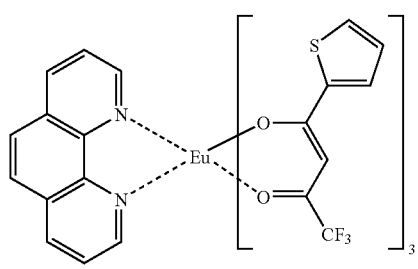
D-18
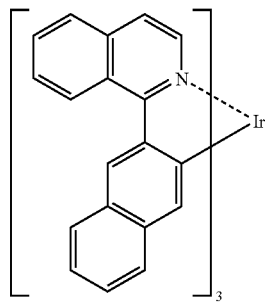
D-19
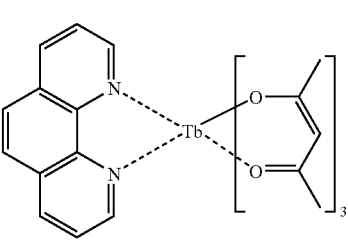
D-20
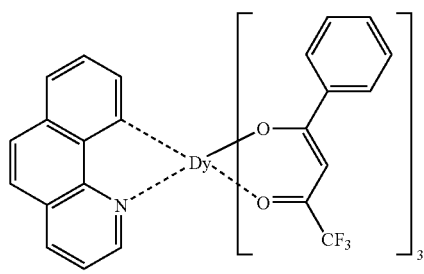
D-21
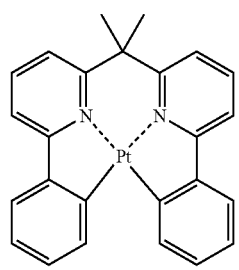
D-22
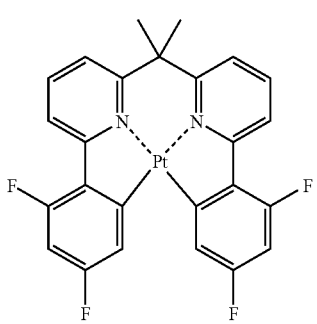

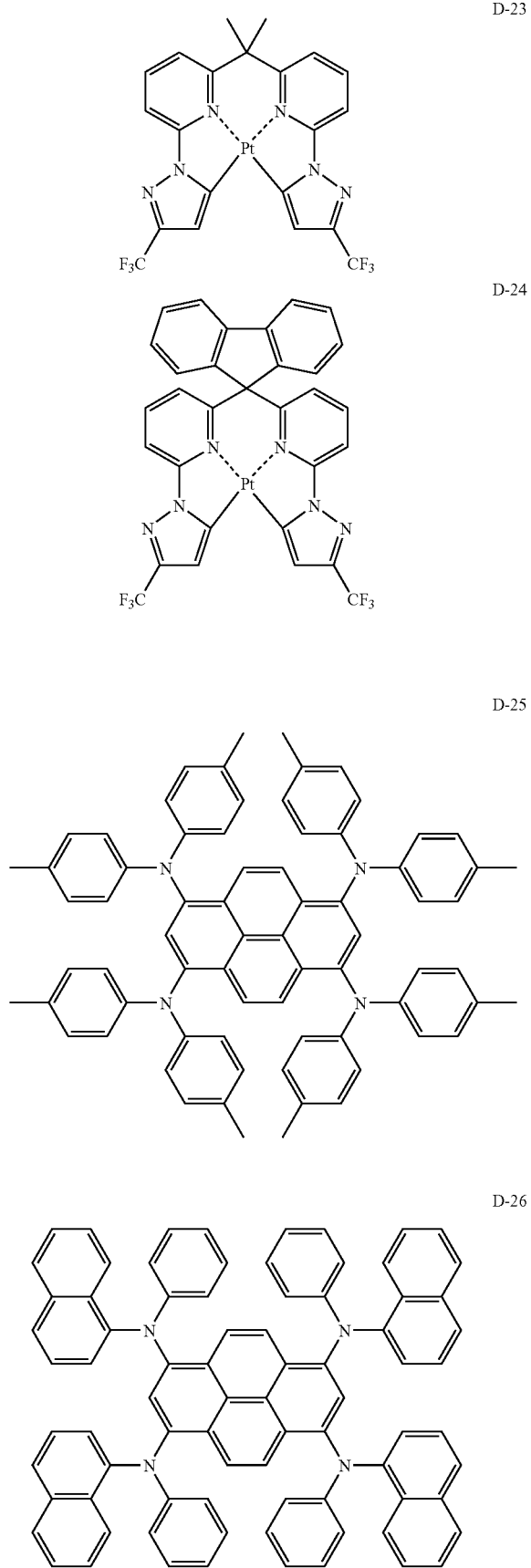

Among the above-described compounds, as the luminescent dopants to be used according to the present invention, D-2, D-3, D-4, D-5, D-6, D-7, D-8, D-9, D-10, D-11, D-12, D-13, D-14, D-15, D-16, D-21, D-22, D-23, D-24, or D-25 to D-28 is preferable, D-2, D-3, D-4, D-5, D-6, D-7, D-8, D-12, D-14, D-15, D-16, D-21, D-22, D-23, D-24, or D-25 to D-28 is more preferable, and D-21, D-22, D-23, D-24, or D-25 to D-28 is further preferable in view of luminescent efficiency, and durability.

The luminescent dopant in a light-emitting layer is contained in an amount of 0.1% by mass to 30% by mass with respect to the total mass of the compounds generally forming the light-emitting layer, but it is preferably contained in an amount of 1% by mass to 15% by mass, and more preferably in an amount of 2% by mass to 12% by mass in view of durability and luminescent durability.

Although a thickness of the light-emitting layer is not particularly limited, 1 nm to 500 nm is usually preferred, and within this range, 5 nm to 200 nm is more preferable, and 5 nm to 100 nm is further preferred in view of luminescent efficiency.

(Host Material)

As the host materials to be used according to the present invention, positive hole transporting host materials excellent in positive hole transporting property (referred to as a "positive hole transporting host" in some cases) and electron transporting host compounds excellent in electron transporting property (referred to as an "electron transporting host" in some cases) may be used.

<<Positive Hole Transporting Host>>

The positive hole transporting host used for the organic layer of the present invention preferably has an ionization potential Ip of 5.1 eV to 6.3 eV, more preferably has an ionization potential of 5.4 eV to 6.1 eV, and further preferably has an ionization potential of 5.6 eV to 5.8 eV in view of improvements in durability and decrease in driving voltage. Furthermore, it preferably has an electron affinity Ea of 1.2 eV to 3.1 eV, more preferably of 1.4 eV to 3.0 eV, and further preferably of 1.8 eV to 2.8 eV in view of improvements in durability and decrease in driving voltage.

Specific examples of such positive hole transporting hosts as mentioned above include pyrrole, carbazole, triazole, oxazole, oxadiazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electroconductive high-molecular oligomers such as thiophene oligomers, polythiophenes and the like, organic silanes, carbon films, derivatives thereof, and the like.

Among these, carbazole derivatives, aromatic tertiary amine compounds, and thiophene derivatives are preferable, and particularly, compounds containing a plurality of carbazole skeletons and/or aromatic tertiary amine skeletons in a molecule are preferred.

As specific examples of the positive hole transporting hosts described above, the following compounds may be listed, but the present invention is not limited thereto.

H-1
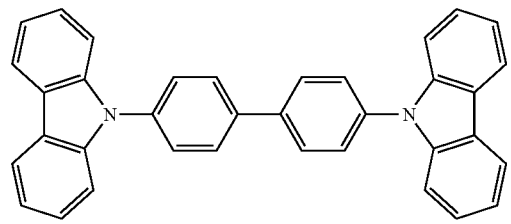

H-2
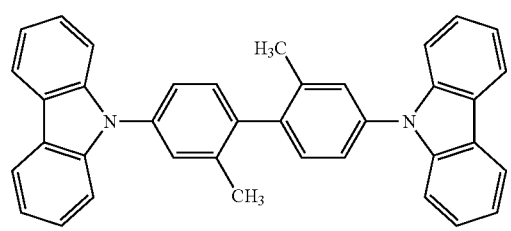

H-3
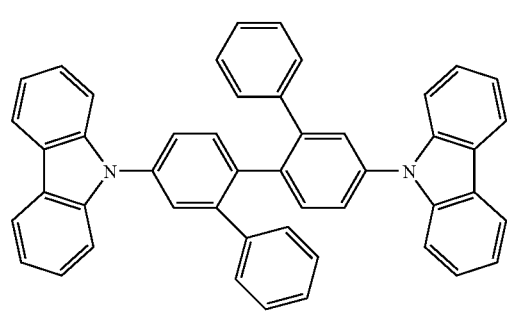

H-4
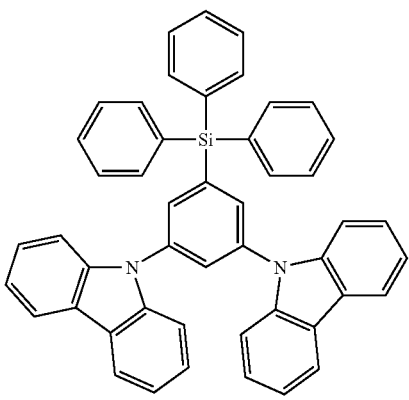

H-5

H-6
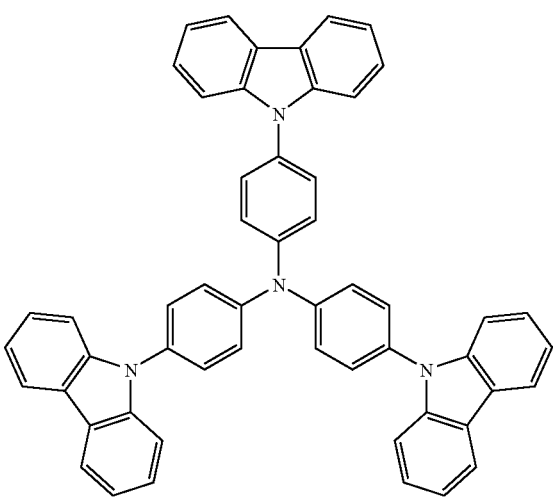

H-7

H-8
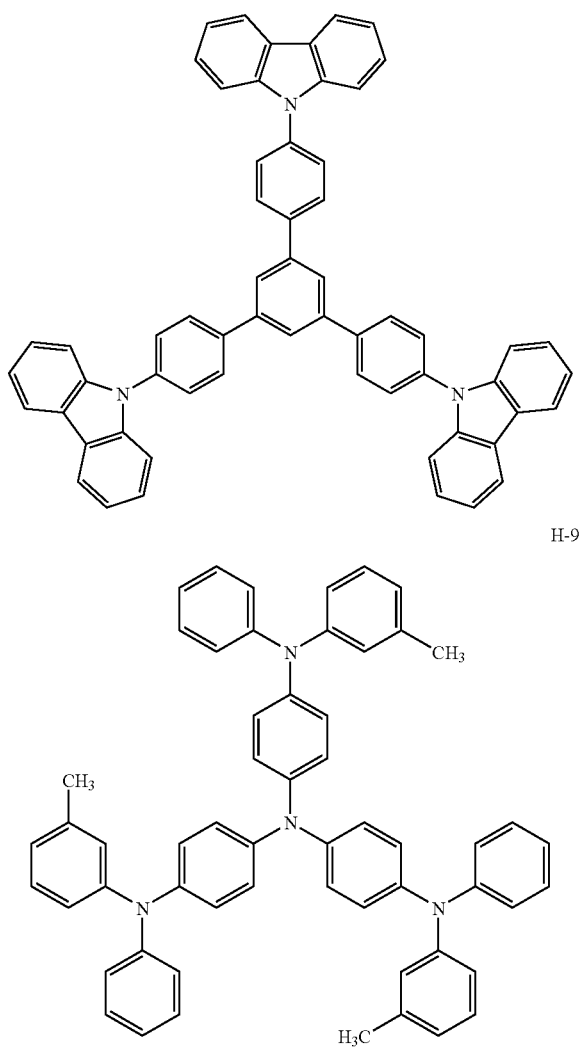
H-9
H-10
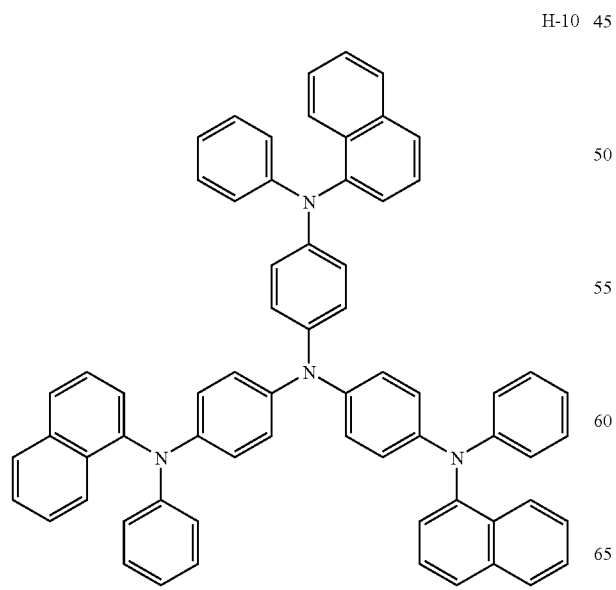
H-11
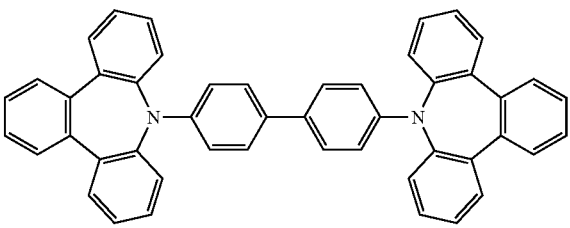
H-12
H-13
H-14
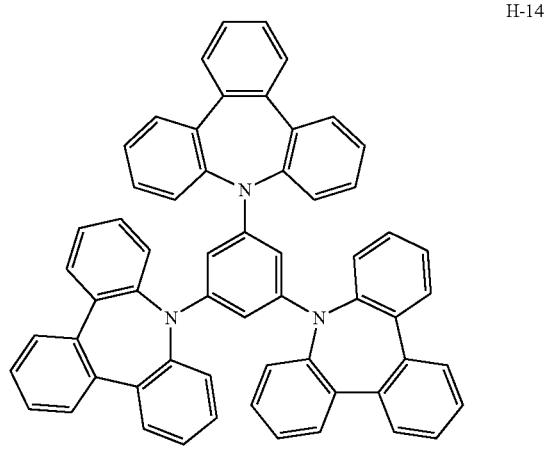

H-15
H-16
H-17
H-18
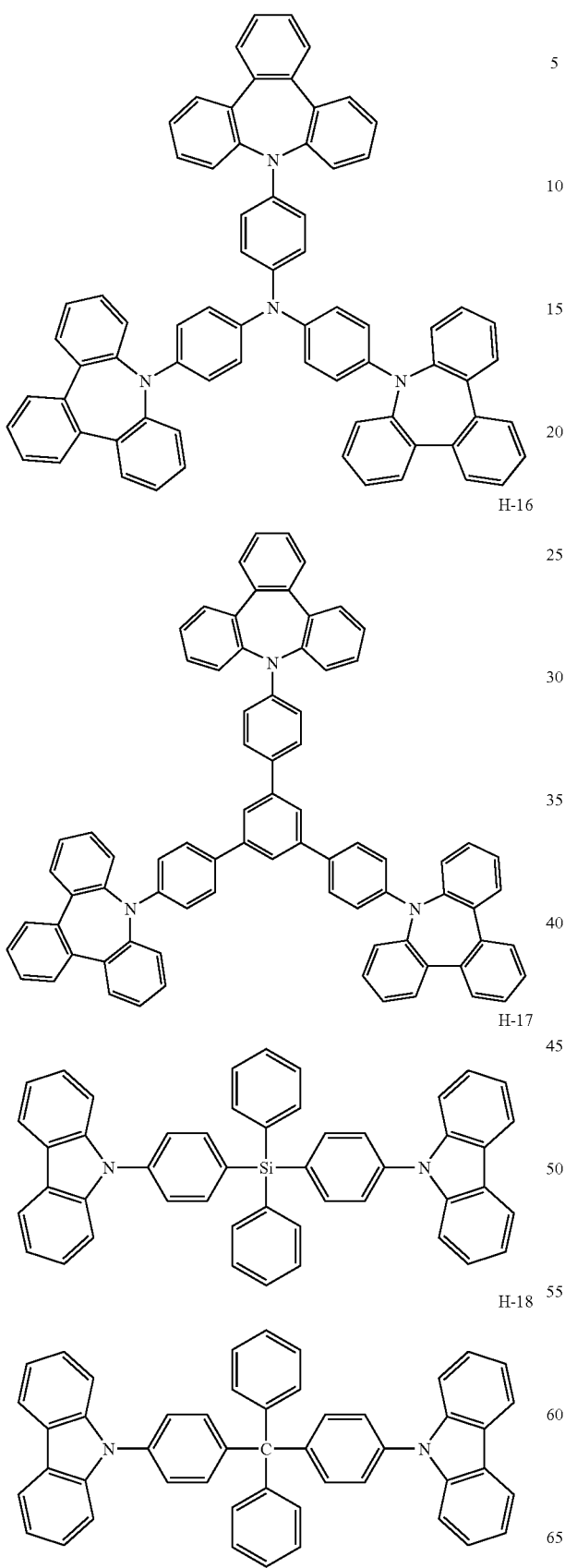
H-19
H-20
H-21
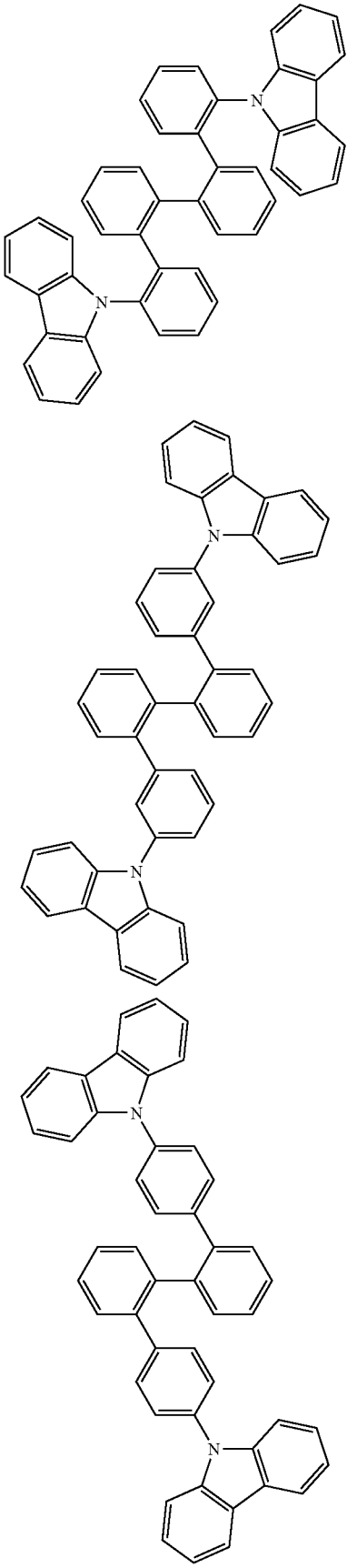

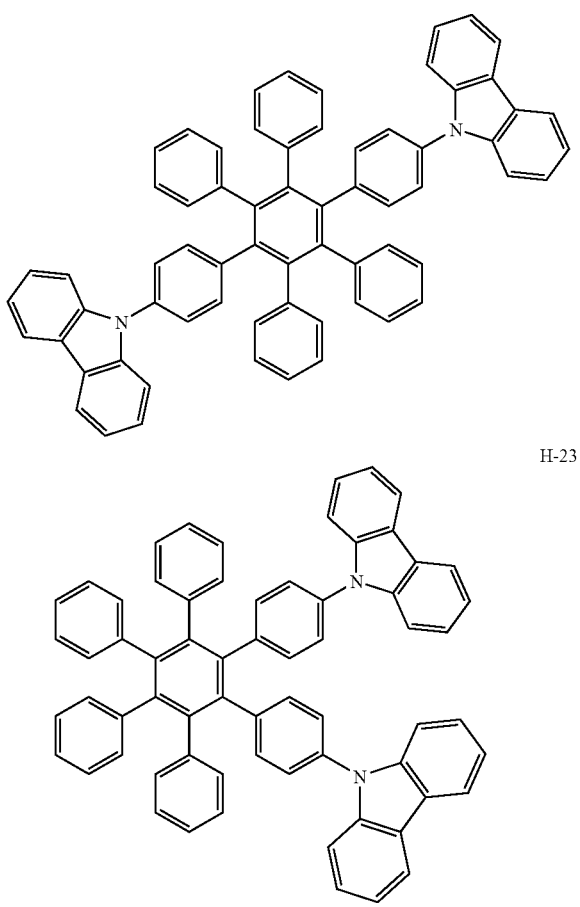

H-22

H-23

<<Electron Transporting Host>>

As the electron transporting host used according to the present invention, it is preferred that an electron affinity Ea of the host is 2.5 eV to 3.5 eV, more preferably 2.6 eV to 3.2 eV, and further preferably 2.8 eV to 3.1 eV in view of improvements in durability and decrease in driving voltage. Furthermore, it is preferred that an ionization potential Ip of the host is 5.7 eV to 7.5 eV, more preferably 5.8 eV to 7.0 eV, and further preferably 5.9 eV to 5.8 eV in view of improvements in durability and decrease in driving voltage.

Specific examples of such electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthaleneperylene and the like, phthalocyanine, derivatives thereof (which may form a condensed ring with another ring), and a variety of metal complexes represented by metal complexes of 8-quinolynol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complexes are preferred according to the present invention in view of durability.

As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and further preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982, and the like.

The ligands are preferably nitrogen-containing heterocyclic ligands (having preferably 1 to 30 carbon atoms, more preferably 2 to 20 carbon atoms, and particularly preferably 3 to 15 carbon atoms); and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, benzooxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in Japanese Patent Application Laid-Open Nos. 2002-235076, 2004-214179, 2004-221062, 2004-221065, 2004-221068, 2004-327313 and the like.

Specific examples of these electron transporting hosts include the following materials, but it should be noted that the present invention is not limited thereto.

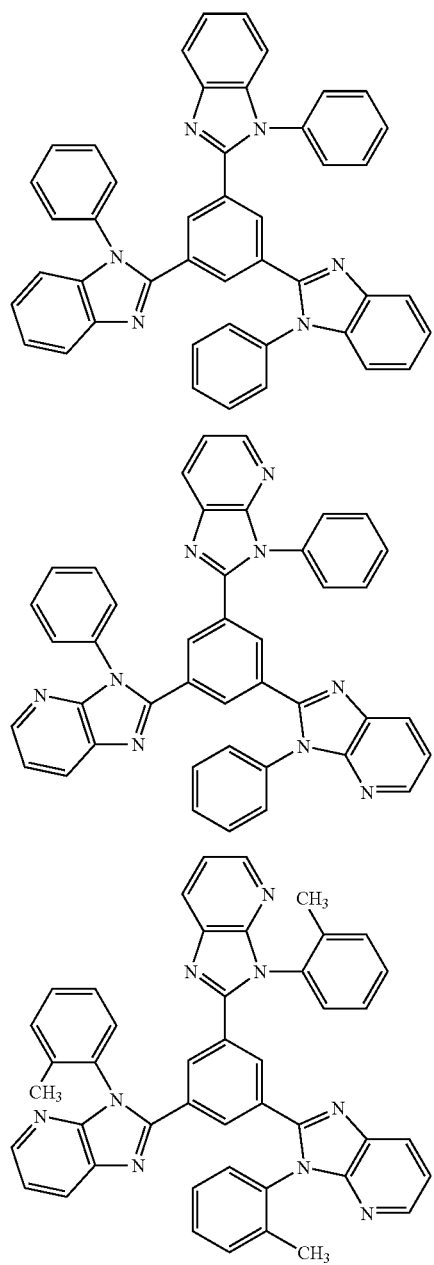

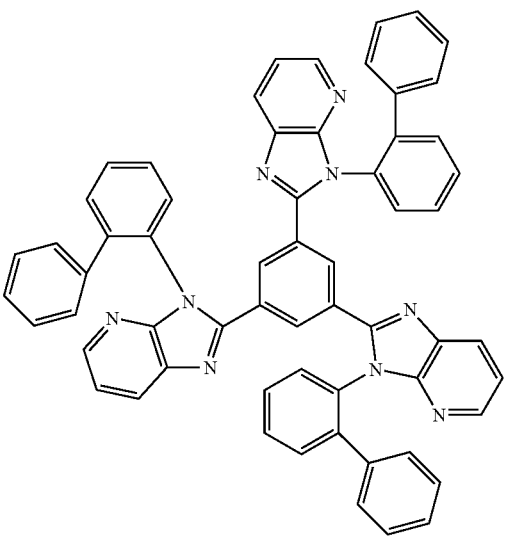

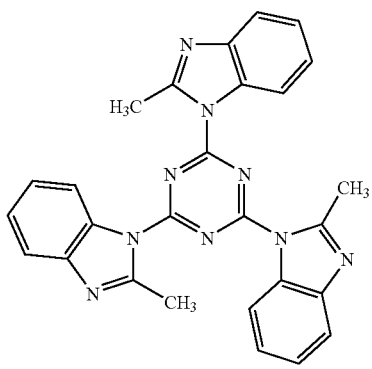

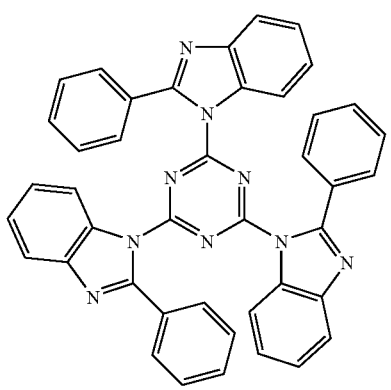

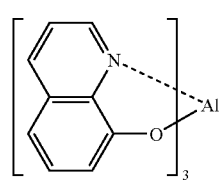

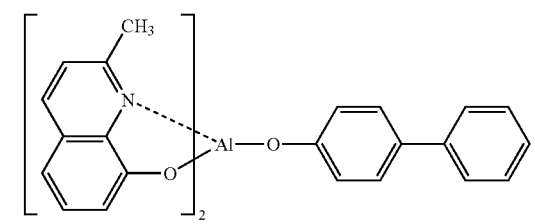
E-8
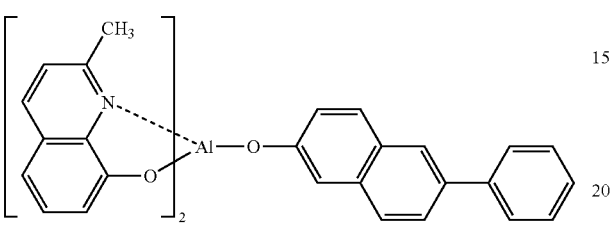
E-9
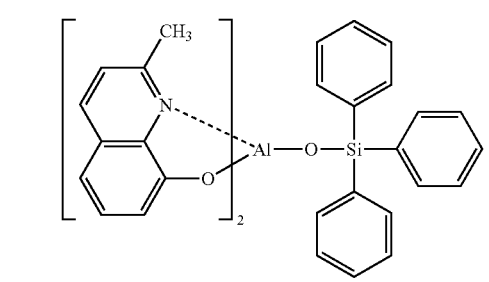
E-10
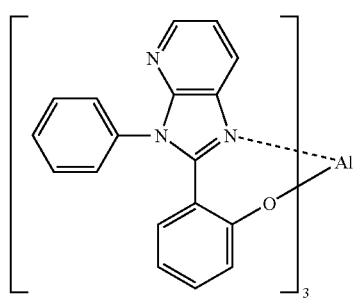
E-11
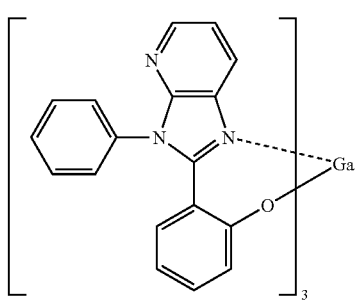
E-12
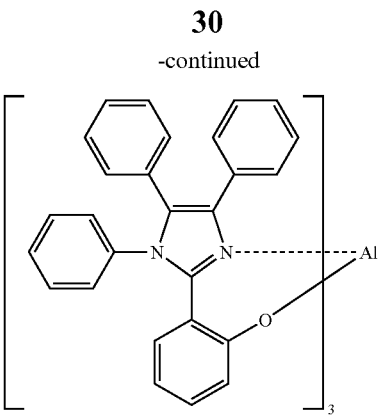
E-13
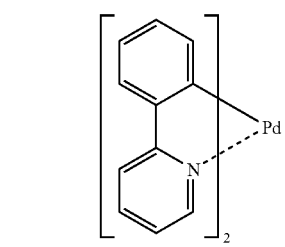
E-14
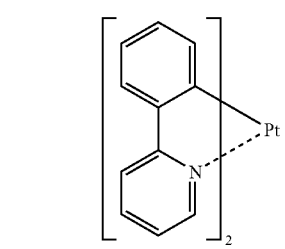
E-15
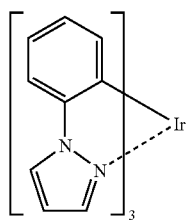
E-16
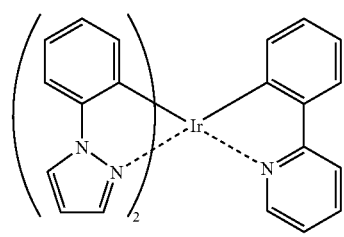
E-17
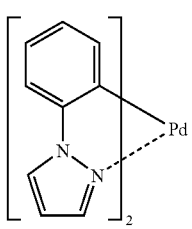
E-18

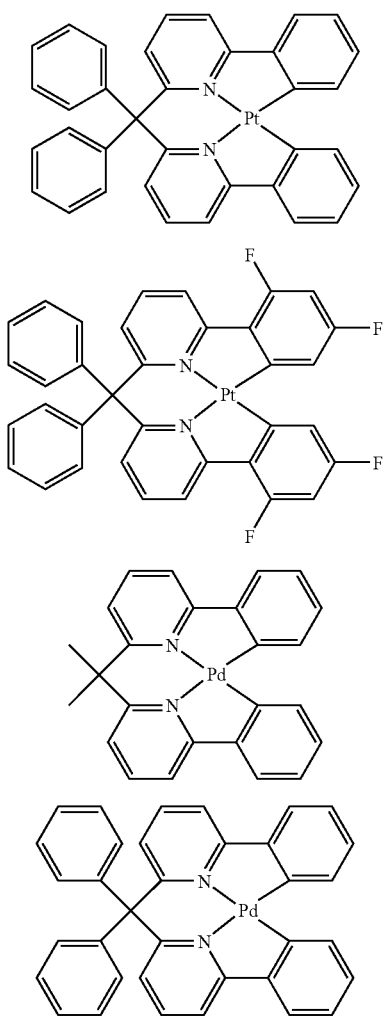

As the electron transportation hosts, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is further preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H) min in the plural host compounds satisfy the relationship of T1(H) min>T1(D) in view of color purity, luminescent efficiency, and driving durability.

Although a content of the host compounds according to the present invention is not particularly limited, it is preferably 15% by mass to 85% by mass with respect to the total mass of the compounds forming the light-emitting layer in view of luminescence efficiency and driving voltage.

A carrier mobility in the light-emitting layer is generally from $10^{-7}$ $cm^2 \cdot V^{-1} \cdot s^{-1}$ to $10^{-1}$ $cm^2 \cdot V^{-1} \cdot s^{-1}$, and within this range, it is preferably from $10^{-6}$ $cm^2 \cdot V^{-1} \cdot s^{-1}$ to $10^{-1}$ $cm^2 \cdot V^{-1} \cdot s^{-1}$, further preferably, from $10^{-5}$ $cm^2 \cdot V^{-1} \cdot s^{-1}$ to $10^{-1}$ $cm^2 \cdot V^{-1} \cdot s^{-1}$, and particularly preferably, from $10^{-4}$ $cm^2 \cdot V^{-1} \cdot s^{-1}$ to $10^{-1}$ $cm^2 \cdot V^{-1} \cdot s^{-1}$ in view of luminescence efficiency.

It is preferred that the carrier mobility of the light-emitting layer is lower than that of the carrier transportation layer, which will be mentioned herein below, in view of luminescence efficiency and driving durability.

The carrier mobility is measured in accordance with the "Time of Flight" method, and the resulting value is determined to be the carrier mobility.

(Positive Hole-Blocking Layer)

A positive hole-blocking layer is a layer having a function to prevent the positive holes transported from the anode to the light-emitting layer from passing through to the cathode side. According to the present invention, a positive hole-blocking layer may be provided as an organic compound layer adjacent to the light-emitting layer on the cathode side.

The positive hole-blocking layer is not particularly limited, but specifically, it may contain an aluminum complex such as BAlq, a triazole derivative, a pyrazabol derivative or the like.

It is preferred that a thickness of the positive hole-blocking layer is generally 50 nm or less in order to lower the driving voltage, more preferably it is 1 nm to 50 nm, and further preferably it is 5 nm to 40 nm.

(Anode)

The anode may generally be any material as long as it has a function as an electrode for supplying positive holes to the organic compound layer, and there is no particular limitation as to the shape, the structure, the size or the like. However, it may be suitably selected from among well-known electrode materials according to the application and purpose of luminescent device. As mentioned above, the anode is usually provided as a transparent anode.

Materials for the anode may preferably include, for example, metals, alloys, metal oxides, electroconductive compounds, and mixtures thereof, and those having a work function of 4.0 eV or more are preferred. Specific examples of the anode materials include electroconductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electroconductive metal oxides; inorganic electroconductive materials such as copper iodide and copper sulfide; organic electroconductive materials such as polyaniline, polythiophene, and polypyrrole; and laminates of these inorganic or organic electron-conductive materials with ITO. Among these, the electroconductive metal oxides are preferred, and particularly, ITO is preferable in view of productivity, high electroconductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence device of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 μm, and preferably 50 nm to 20 μm.

A value of resistance of the anode is preferably $10^3 \Omega/\square$ or less, and $10^2 \Omega/\square$ or less is more preferable. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHUNTEN-KAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electroconductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by mass to 10% by mass of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 μm, and preferably 50 nm to 1 μm.

Moreover, the cathode may be transparent or opaque. The transparent cathode may be formed by preparing a material for the cathode with a small thickness of 1 nm to 10 nm, and further laminating a transparent electroconductive material such as ITO or IZO thereon.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimension stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence device of the present invention may be sealed with a sealing cap.

Furthermore, a moisture absorbent or an inert liquid may be used to seal a space defined between the sealing cap and the luminescent device. Although the moisture absorbent is not particularly limited. Specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

In the organic electroluminescence device of the present invention, when a DC (AC components may be contained as needed) voltage (usually 2 volts to 15 volts) or DC is applied across the anode and the cathode, luminescence can be obtained.

The driving durability of the organic electroluminescence device according to the present invention can be determined based on the brightness halftime at a specified brightness. For instance, the brightness halftime may be determined by using a source measure unit, model 2400, manufactured by KEITHLEY to apply a DC voltage to the organic EL device to cause it to emit light, conducting a continuous driving test under the condition that the initial brightness is 2000 $cd/m^2$, defining the time required for the brightness to reach 1000 $cd/m^2$ as the brightness halftime T (½), and then comparing the resulting brightness halftime with that of a conventional luminescent device. According to the present invention, the numerical value thus obtained was used.

An important characteristic parameter of the organic electroluminescence device of the present invention is external quantum efficiency. The external quantum efficiency is calculated by "the external quantum efficiency ($\phi$)=the number of photons emitted from the device/the number of electrons injected to the device", and it may be said that the larger the value obtained is, the more advantageous the device is in view of electric power consumption.

Moreover, the external quantum efficiency of the organic electroluminescence device is decided by "the external quantum efficiency ($\phi$)=the internal quantum efficiency×light-extraction efficiency". In an organic EL device which utilizes the fluorescent luminescence from the organic compound, an upper limit of the internal quantum efficiency is 25%, while the light-extraction efficiency is about 20%, and accordingly, it is considered that an upper limit of the external quantum efficiency is about 5%.

From the standpoint of reducing power consumption and increasing driving durability, the external quantum efficiency of a device is preferably 6% or more, and particularly preferably 12% or more.

As the numerical value of the external quantum efficiency, the maximum value thereof when the device is driven at 20° C., or a value of the external quantum efficiency at about 100 $cd/m^2$ to 300 $cd/m^2$ (preferably 200 $cd/m^2$) when the device is driven at 20° C. may be used.

According to the present invention, a value obtained by the following method is used. Namely, a DC constant voltage is applied to the EL device by the use of a source measure unit, model 2400, manufactured by Toyo TECHNICA Corporation to cause it to emit light, the brightness of the light is measured by using a brightness photometer (trade name: BM-8, manufactured by Topcon Corporation), and then, the external quantum efficiency at 200 $cd/m^2$ is calculated.

Further, an external quantum efficiency of the luminescent device may be obtained by measuring the luminescent brightness, the luminescent spectrum, and the current density, and calculating the external quantum efficiency from these results and a specific visibility curve. In other words, using the current density value, the number of electrons injected can be calculated. By an integration calculation using the luminescent spectrum and the specific visibility curve (spectrum), the luminescent brightness can be converted into the number of photons emitted. From the result, the external quantum efficiency (%) can be calculated by "(the number of photons emitted/the number of electrons injected to the device)×100".

For the driving method of the organic electroluminescence device of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

(Application of the Organic Electroluminescence Device of the Present Invention)

The organic electroluminescence device of the present invention can be appropriately used for indicating elements, displays, backlights, electronic photographs, illumination light sources, recording light sources, exposure light sources, reading light sources, signages, advertising displays, interior accessories, optical communications and the like.

EXAMPLES

In the following, examples of the organic electroluminescence device of the present invention will be described, but it should be noted that the present invention is not limited to these examples.

Example 1

1. Preparation of the Organic EL Device (Preparation of Comparative Organic EL Device No. A1)

A 2.5 cm square ITO glass substrate having a 0.5 mm thickness (manufactured by Geomatec Co., Ltd.; surface resistance: 10Ω/□) was placed in a washing container to apply ultrasonic cleaning in 2-propanol, and then, UV-ozone treatment was applied for 30 minutes. On the transparent anode, the following layers were deposited in accordance with a vacuum deposition method. In the examples of the present invention, a deposition rate was 0.2 nm/second, unless otherwise specified, wherein the deposition rate was measured by the use of a quartz oscillator. The thicknesses of layers described below were also measured by using the quartz oscillator.

—Positive Hole Injection Layer (Not Containing Acceptor)—Evaporation of 2-TNATA was conducted at the deposition rate of 0.5 nm/second. The thickness was 140 nm.

—Positive Hole-Transport Layer—

On the positive hole-injection layer, α-NPD was evaporated at a deposition rate of 0.5 nm/second. The thickness was 10 nm.

—Light-Emitting Layer—

Ternary coevaporation was conducted in such that CBP (positive hole transportation host) and ETM-1 (electron transporting host) were each deposited at a rate of 0.3 nm/second, and an amount of phosphorescence luminescent dopant EM-1 was 8% by mass with respect to the total organic materials in the light-emitting layer. The thickness of the light-emitting layer was 30 nm.

—Electron-Transport Layer—

Balq was deposited at a thickness of 40 nm (deposition rate: 0.3 nm/second).

—Electron Injection Layer and Cathode—

On the resulting layers, a patterned mask (mask by which the light emitting region becomes 2 mm×2 mm) was disposed, and lithium fluoride was evaporated at a thickness of 1 nm at a deposition rate of 0.1 nm/second to obtain an electron injection layer. Further, metal aluminum was deposited thereon with a 100 nm thickness to obtain a cathode.

The prepared lamination body was placed in a globe box whose the contents were replaced by argon gas, and it was sealed by the use of a sealing cap made of stainless steel and a UV curable adhesive (trade name: XNR5516HV, manufactured by Nagase-Ciba Co., Ltd.).

Thus, the comparative organic EL device No. A1 was obtained.

(Preparation of Comparative Organic EL Devices Nos. A2 to A5)

Comparative organic EL devices Nos. A2 to A5 were prepared in a similar manner to that in organic EL device No. A1 except that acceptors were added to the hole injection layer as described in Table 1.

Vapor-deposition conditions of the acceptor:

1) In a Case of $MoO_3$

Vapor-deposition was performed such that $MoO_3$ (metal oxide acceptor) was evaporated at 0.01 nm/s, while 2-TNATA (hole injecting material) was evaporated at 0.09 nm/s. The thickness of the hole injection layer was 280 nm.

2) In a Case of $V_2O_3$

Vapor-deposition was performed such that: $V_2O_5$ (metal oxide acceptor) was evaporated at 0.01 nm/s, while 2-TNATA (a hole injecting material) was evaporated at 0.09 nm/s. The thickness of the hole injection layer was 280 nm.

(Preparation of Organic EL Device No. 1 According to the Present Invention)

An organic EL device No. 1 was prepared in a similar manner to that in organic EL device No. A1 except that two types of acceptors were added to the hole injection layer as described in Table 1.

Vapor-Deposition Conditions of the Acceptor:

Ternary co-vapor-deposition was performed such that $MoO_3$ (metal oxide acceptor) and F4-TCNQ (non-metal acceptor) were evaporated at 0.003 nm/s and at 0.0001 nm/s, respectively, while 2-TNATA (hole injecting material) was evaporated at 0.0969 nm/s. The thickness of the hole injection layer was 280 nm.

TABLE 1

| Device No. | First Acceptor Compound | First Acceptor Amount (% by mass) | Second Acceptor Compound | Second Acceptor Amount (% by mass) | Thickness of layer (nm) | Remarks |
|---|---|---|---|---|---|---|
| A1 | — | — | — | — | 280 | Comparative |
| A2 | $MoO_3$ | 10 | — | — | 280 | Comparative |
| A3 | $MoO_3$ | 3 | — | — | 280 | Comparative |
| A4 | $V_2O_5$ | 3 | — | — | 280 | Comparative |
| A5 | — | — | F4-TCNQ | 0.1 | 280 | Comparative |
| 1 | $MoO_3$ | 3 | F4-TCNQ | 0.1 | 280 | Invention |

2. Evaluation (Evaluation Terms)

(1) Light Emitting Efficiency

External quantum efficiency of the light emitting device was obtained by firstly measuring light emission luminance, light emitting spectrum and current density and thereafter, by calculating it from these measurement results and a specific luminosity curve. The external quantum efficiency (%) was calculated in accordance with "number of luminous photons/number of electrons inputted into device)×100".

(2) Driving Voltage

Driving voltage at a driving current density of 10 mA/cm$^2$ was measured.

(3) Driving Durability

A continuous driving test was conducted under a condition of an initial luminance of 500 cd/m$^2$ and a time period until luminance reached 200 cd/m$^2$ was determined as a luminance degradation time.

(Results)

Obtained results were shown in Table 2.

TABLE 2

| Device No. | Driving Voltage (V) | Light Emitting Efficiency (%) | Driving Durability (hour) | Remarks |
|---|---|---|---|---|
| A1 | 17.390 | 1.94 | 9 | Comparative |
| A2 | 8.130 | 1.72 | 250 | Comparative |
| A3 | 10.640 | 1.81 | 65 | Comparative |
| A4 | 11.440 | 1.70 | 60 | Comparative |
| A5 | 8.710 | 2.28 | 14 | Comparative |
| 1 | 8.260 | 2.33 | 51 | Invention |

The sample No. 1 according to the invention had a low driving voltage and a high light emission efficiency compared with comparative samples and was able to realize a prolonged lifetime of driving durability.

Example 2

1. Preparation of Sample

An organic EL device No. 11 according to the invention was prepared in a similar manner to that in the organic EL device No. 1 in Example 1 except that a composition of acceptors of the hole injection layer was changed into that as described in Table 3.

TABLE 3

| Device No. | First Acceptor Compound | First Acceptor Amount (% by mass) | Second Acceptor Compound | Second Acceptor Amount (% by mass) | Thickness of layer (nm) | Remarks |
|---|---|---|---|---|---|---|
| 11 | $V_2O_5$ | 3 | F4-TCNQ | 0.1 | 280 | Invention |

2. Evaluation of Performance

Thus prepared device was evaluated as similar manner to that in Example 1 and was shown the results in Table 4.

From the results, it was understood that the sample according to the invention had a low driving voltage and a high light emission efficiency and was able to realize a prolonged lifetime of driving durability.

TABLE 4

| Device No. | Driving Voltage (V) | Light Emitting Efficiency (%) | Driving Durability (hour) | Remarks |
|---|---|---|---|---|
| 11 | 8.26 | 2.29 | 62 | Invention |

Example 3

1. Preparation of Sample

An organic EL device No. 21 according to the invention was prepared in a similar manner to that in the organic EL device 1 in Example 1 except that an acceptor was added into the hole transport layer.

2. Performance Evaluation

Results obtained by evaluating in a similar manner to that in Example 1 are shown in Table 5.

From these results, light emitting efficiency was decreased when the acceptor was added to the hole transport layer. In order to simultaneously improve driving durability and light emitting efficiency, it is preferable that the hole transport layer does not contain the acceptor.

TABLE 5

| Device No | Acceptor in Hole Transport Layer Compound | Acceptor in Hole Transport Layer Amount (% by mass) | Thickness of Hole Transport Layer (nm) | Driving Voltage (V) | Light Emitting Efficiency (%) | Driving Durability (hour) | Remarks |
|---|---|---|---|---|---|---|---|
| 1 | — | — | 10 | 8.26 | 2.33 | 51 | Invention |
| 21 | F4-TCNQ | 0.1 | 10 | 8.10 | 2.03 | 49 | Invention |

Example 4

Light Emitting Layer

A co-vapor-deposition of CBP and tbppy was conducted such that CBP which was a host was set to be at a vapor-deposition rate of 0.1 nm/sec and a light emitting dopant: tbppy occupied 12% by mass of an entire organic material in a light emitting layer. A film thickness of the light emitting layer was set to be 30 nm.

(Preparation of Comparative Organic EL Devices Nos. A12 to A14)

Comparative organic EL devices Nos. A12 to A14 were prepared in a similar manner to that in the organic EL device No. A11 except that acceptors were each added to the hole injection layer as described below.

A12: containing the metal oxide acceptor in a uniform concentration (10% by mass).

Co-vapor-deposition was performed with metal oxide acceptor: $MoO_3$ at 0.01 nm/s, while the hole injecting material: 2-TNATA at 0.09 nm/s.

A13: containing the metal oxide acceptor in a uniform concentration (1% by mass).

Co-vapor-deposition was performed with $MoO_3$ (metal oxide acceptor) at 0.001 nm/s, while 2-TNATA (hole injecting material) at 0.099 nm/s.

A14: the hole injection layer being made of 2 sub-layers, and containing the metal oxide acceptor in a stepwise concentration (constitution as described in WO 2005-64994A1).

This is a comparative sample in which the hole injection layer at the side of the light emitting layer contains the metal oxide acceptor in a high concentration.

Vapor-deposition was performed by firstly using $MoO_3$ (metal oxide acceptor) such that $MoO_3$ was evaporated at 0.001 nm/s, while 2-TNATA (hole injecting material): was evaporated at 0.099 nm/s. The thickness of the hole injection layer was 20 nm.

Further, vapor-deposition was performed such that $MoO_3$ was evaporated at 0.001 nm/s against 2-TNATA (hole injecting material:) was evaporated at 0.099 nm/s. The thickness of the hole injection layer was 260 nm.

A content of $MoO_3$ in the hole injection layer at the side of the anode is 1% by mass, while that at the side of the light emitting layer is 10% by mass.

(Preparation of Organic EL Devices NOs. 101 to 105 According to the Invention)

Organic EL devices Nos. 101 to 105 according to the invention were prepared in a similar manner to that in the organic EL device No. A11 except that acceptors were each added to the hole injection layer as described below and in Table 6.

Device No. 101: the hole injection layer being made of 2 sub-layers, and containing the metal oxide acceptor in a stepwise concentration distribution such that it is contained in a lower concentration toward the side of the light emitting layer.

Vapor-deposition was performed such that $MoO_3$ (metal oxide acceptor) was evaporated at 0.01 nm/s, while 2-TNATA (hole injecting material) was evaporated at 0.09 nm/s. The thickness of the hole injection layer was 20 nm. Further, vapor-deposition was performed such that $MoO_3$ (metal oxide acceptor) was evaporated at 0.001 nm/s against 2-TNATA (hole injecting material) was evaporated at 0.099 nm/s. The thickness of the hole injection layer was 260 nm.

A content of $MoO_3$ in the hole injection layer at the side of the anode is 10% by mass, while that at the side of the light emitting layer is 1% by mass.

Device 102: the hole injection layer being made of 2 sub-layers, and containing the metal oxide acceptor in a stepwise concentration distribution such that it is contained in a lower concentration toward the side of the light emitting layer.

Vapor-deposition was performed such that $MoO_3$ (metal oxide acceptor) was evaporated at 0.05 nm/s, while 2-TNATA (hole injecting material) was evaporated at 0.05 nm/s. The thickness of the hole injection layer was 20 nm. Further, vapor-deposition was performed such that was doped with $MoO_3$ (metal oxide acceptor) was evaporated at 0.007 nm/s, while 2-TNATA (hole injecting material) was evaporated at 0.093 nm/s. The thickness of the hole injection layer was 260 nm.

A content of $MoO_3$ in the hole injection layer at the side of the anode is 50% by mass, while that at the side of the light emitting layer is 7% by mass.

Device No. 103: the hole injection layer being made of 2 sub-layers, and containing the metal oxide acceptor and the organic acceptor in a stepwise concentration such that they are each contained in a lower concentration toward the side of the light emitting layer.

Ternary vapor-deposition was performed such that $MoO_3$ (metal oxide acceptor) and F4-TCNQ (organic acceptor) were evaporated at 0.1 nm/s and 0.001 nm/s, respectively, while 2-TNATA (hole injecting material) was evaporated at 0.899 nm/s. The thickness of the hole injection layer was 20 nm. Further, ternary vapor-deposition was performed such that $MoO_3$ (metal oxide acceptor) and F4-TCNQ (organic acceptor) were evaporated at 0.01 nm/s and 0.001 nm/s, respectively, while 2-TNATA (hole injecting material) was evaporated at 0.989 nm/s. The thickness of the hole injection layer was 260 nm.

A content of $MoO_3$ in the hole injection layer at the side of the anode is 10% by mass, while that at the side of the light emitting layer is 1% by mass.

Device No. 104: the hole injection layer being made of 3 sub-layers, and containing the metal oxide acceptor and the organic acceptor in a stepwise concentration distribution such that they are each contained in a lower concentration toward the side of the light emitting layer.

Vapor-deposition was performed such that $MoO_3$ (metal oxide acceptor) was evaporated at 0.1 nm/s, while 2-TNATA (hole injecting material) was evaporated at 0.9 nm/s. The thickness of the hole injection layer was 20 nm. Further, ternary vapor-deposition was performed such that $MoO_3$ (metal oxide acceptor) and F4-TCNQ (organic acceptor) were evaporated at 0.01 nm/s and 0.001 nm/s, respectively, while 2-TNATA (hole injecting material) was evaporated at 0.989 nm/s. The thickness of the hole injection layer was 130 nm. Still further, co-vapor-deposition was performed thereon such that $MoO_3$ (metal oxide acceptor) was evaporated at 0.01 nm/s while 2-TNATA (the hole injecting material) was evaporated at 0.989 nm/s. The thickness of the hole injection layer was 130 nm.

A content of $MoO_3$ in the hole injection layer at the side of the anode is 10% by mass, while those in the intermediate hole injection layer and in hole injection layer at the side of the light emitting layer are each 1% by mass.

Device 105: the hole injection layer being made of 3 sub-layers, and containing the metal oxide acceptor and the organic acceptor in a stepwise concentration distribution such that the metal oxide acceptor is contained in a lower concentration toward the side of the light emitting layer while the organic acceptor is contained in a higher concentration toward the side of the light emitting layer.

Co-vapor-deposition was performed such that the metal oxide acceptor $MoO_3$ was evaporated at 0.1 nm/s, while the hole injecting material 2-TNATA was evaporated at 0.9 nm/s. The thickness of the hole injection layer was 20 nm. Further, ternary vapor-deposition was performed such that the metal oxide acceptor $MoO_3$ and the organic acceptor F4-TCNQ were evaporated at 0.01 nm/s and 0.001 nm/s, respectively, while the hole injecting material 2-TNATA was evaporated at 0.989 nm/s. The thickness of the hole injection layer was 130 nm. Still further, co-vapor-deposition was performed thereon such that the organic acceptor F4-TCNQ was evaporated at 0.001 nm/s, while the hole injecting material 2-TNATA was evaporated at 0.999 nm/s. The thickness of the hole injection layer was 130 nm.

A content of $MoO_3$ in the hole injection layer at the side of the anode is 10% by mass, while that in the intermediate hole injection layer is 1% by mass and that in the hole injection layer at the side of the light emitting layer is 0% by mass.

Compared with the comparative devices Nos. A11 and A13, the devices according to the invention were low in driving voltage and, particularly, were able to realize a prolonged lifetime of driving durability. Further, compared with the comparative devices Nos. A12 and A14, the devices according to the invention have improved in light emitting efficiency.

TABLE 6

| Device No | Distribution of Acceptor-concentration | Hole Injection Layer Metal Oxide Acceptor Compound (% by mass) | Organic Acceptor Compound (% by mass) | Thickness of layer (nm) | Remarks |
|---|---|---|---|---|---|
| A1 | — | — | — | 280 | Comparative |
| A2 | uniform | MoO₃ (10) | — | 280 | Comparative |
| A3 | uniform | MoO₃ (1) | — | 280 | Comparative |
| A4 | first layer (anode side) | MoO₃ (1) | — | 20 | Comparative |
|  | second layer (light emitting layer side) | MoO₃ (10) | — | 260 |  |
| 1 | first layer (anode side) | MoO₃ (10) | — | 20 | Invention |
|  | second layer (light emitting layer side) | MoO₃ (1) | — | 260 |  |
| 2 | first layer (anode side) | MoO₃ (50) | — | 20 | Invention |
|  | second layer (light emitting layer side) | MoO₃ (7) | — | 260 |  |
| 3 | first layer (anode side) | MoO₃ (10) | F4-TCNQ (0.1) | 20 | Invention |
|  | second layer (light emitting layer side) | MoO₃ (1) | F4-TCNQ (0.1) | 260 |  |
| 4 | first layer (anode side) | MoO₃ (10) | F4-TCNQ (0.0) | 20 | Invention |
|  | second layer (intermediate layer) | MoO₃ (1) | F4-TCNQ (0.1) | 130 |  |
|  | third layer (light emitting layer side) | MoO₃ (1) | F4-TCNQ (0.0) | 130 |  |
| 5 | first layer (anode side) | MoO₃ (10) | F4-TCNQ (0.0) | 20 | Invention |
|  | second layer (intermediate layer) | MoO₃ (1) | F4-TCNQ (0.1) | 130 |  |
|  | third layer (light emitting layer side) | MoO₃ (0) | F4-TCNQ (0.1) | 130 |  |

TABLE 7

| Device No. | Driving Voltage (V) | Light Emitting Efficiency (%) | Driving Durability (hour) | Remarks |
|---|---|---|---|---|
| A1 | 17.39 | 1.94 | 9 | Comparative |
| A2 | 8.13 | 1.72 | 250 | Comparative |
| A3 | 10.88 | 2.12 | 13 | Comparative |
| A4 | 8.44 | 1.70 | 180 | Comparative |
| 1 | 9.05 | 2.11 | 45 | Invention |
| 2 | 8.05 | 2.01 | 73 | Invention |
| 3 | 8.62 | 2.83 | 140 | Invention |
| 4 | 8.48 | 2.88 | 120 | Invention |
| 5 | 8.55 | 2.56 | 80 | Invention |

Example 5

1. Preparation of Sample

Organic EL device No. 121 according to the invention was prepared in a similar manner to that in the device No. 101 in Example 4 except that an acceptor was added to the hole transport layer.

2. Performance Evaluation

Results obtained by evaluation conducted in a similar manner to that in Example 4 are shown in Table 8.

As a result, light emitting efficiency was decreased by incorporating the acceptor into the hole transport layer. When the acceptor was not contained in the hold transport layer, a favorable performance was exhibited.

TABLE 8

| Device No | Acceptor of Hole transport Layer Compound | Acceptor of Hole transport Layer Amount (% by mass) | Thickness of Hole transport Layer (nm) | Driving Voltage (V) | Light Emitting Efficiency (%) | Driving Durability (hour) | Remarks |
|---|---|---|---|---|---|---|---|
| 1 | — | — | 10 | 9.05 | 2.11 | 45 | Invention |
| 21 | F4-TCNQ | 0.1 | 10 | 8.58 | 1.91 | 55 | Invention |

What is claimed is:

1. An organic electroluminescence device comprising at least a light emitting layer between an anode and a cathode opposing each other, and further comprising an organic layer having a metal oxide as an acceptor between the light emitting layer and the anode, wherein a concentration of the metal oxide in the organic layer is varied in a thickness direction thereof, and the concentration is lower in a portion near the light emitting layer than in a portion near the anode.

2. The organic electroluminescence device according to claim 1, wherein a ratio Cmax/Cmin of a concentration Cmax in a region of the organic layer having the highest concentration of the metal oxide to a concentration Cmin in a region of the organic layer having the lowest concentration of the metal oxide is 2 or more.

3. The organic electroluminescence device according to claim 1, wherein the metal oxide as the acceptor is a metal oxide capable of forming a charge transfer complex.

4. The organic electroluminescence device according to claim 1, wherein the organic layer including the acceptor is a hole injection layer.

5. The organic electroluminescence device according to claim 4, wherein the hole injection layer contains an organic compound which does not contain a metal, as an acceptor.

6. The organic electroluminescence device according to claim 5, wherein the organic compound which does not contain a metal is 7,7,8,8-tetrafluorotetracyanoquinodimethane.

7. The organic electroluminescence device according to claim 1, wherein the organic electroluminescence device further comprises a hole transport layer between the organic layer having the acceptor and the anode.

8. The organic electroluminescence device according to claim 7, wherein the hole transport layer does not substantially contain the acceptor.

9. The organic electroluminescence device according to claim 1, wherein the acceptor is molybdenum oxide or vanadium oxide.

10. The organic electroluminescence device according to claim 1, wherein the organic layer comprises a hole transport layer made of 2 or more sub-layers, and a concentration of the metal oxide is different in each sub-layer.

* * * * *